United States Patent
Kim et al.

[11] Patent Number: 5,770,475
[45] Date of Patent: Jun. 23, 1998

[54] CRYSTAL GROWTH METHOD FOR COMPOUND SEMICONDUCTOR

[75] Inventors: Sung-Bock Kim; Jeong-Rae Ro; El-Hang Lee, all of Daejeon, Rep. of Korea

[73] Assignee: Electronics and Telecommunications Research Institute, Daejeon, Rep. of Korea

[21] Appl. No.: 717,903

[22] Filed: Sep. 23, 1996

[51] Int. Cl.[6] ................................................ H01L 21/00
[52] U.S. Cl. ................................................ 438/43; 438/44
[58] Field of Search .......................... 437/129; 372/45; 438/42, 43, 44

[56] References Cited

U.S. PATENT DOCUMENTS

| | | | |
|---|---|---|---|
| 3,915,765 | 10/1975 | Cho et al. | 437/107 |
| 4,278,949 | 7/1981 | Marchall et al. | 331/94.5 |
| 4,922,500 | 5/1990 | Chang-Hasnain et al. | 372/45 |
| 4,987,094 | 1/1991 | Colas et al. | 437/129 |
| 5,040,032 | 8/1991 | Kapon | 372/45 |
| 5,114,877 | 5/1992 | Paoli et al. | 437/129 |
| 5,120,664 | 6/1992 | Murotani | 437/2 |
| 5,528,615 | 6/1996 | Shima | 437/45 |
| 5,577,062 | 11/1996 | Takahashi | 372/45 |

*Primary Examiner*—Brian Dutton
*Attorney, Agent, or Firm*—Nixon & Vanderhye P.C.

[57] ABSTRACT

A crystal growth method for a compound semiconductor is capable of forming a plurality of quantum wells (formed of a barrier layer having a large energy band gap and an active layer having a small energy band gap) on the compound semiconductor substrate. After etching a V-shaped groove having a (111) surface with a predetermined angle θ1 with respect to the (100) surface on the GaAs semiconductor substrate, the substrate is further etched by a hydrochloric solution and a solution of $H_2SO_4:H_2O_2:H_2O=20:1$ to cause the V-shaped groove walls to become a non-(111) surface having a lower predetermined slope angle θ2. The quantum wells then grown in the bottom of the V-shaped groove will be effectively disconnected from simultaneous growths on the side walls of the groove thus giving rise to closely controlled multi-dimensional quantum well structures.

12 Claims, 3 Drawing Sheets

CRYSTAL GROWTH METHOD FOR COMPOUND SEMICONDUCTOR

BACKGROUND OF THE INVENTION

1. Field of the Invention

The present invention relates to a crystal growth method for a compound semiconductor, and particularly to an improved crystal growth method for a compound semiconductor which is capable of adjusting the size of a horizontal size perpendicular to an axis direction thus achieving a quantum wire and a quantum dot.

2. Description of the Conventional Art

Recently, as equipment for practicing thin film growth techniques such as molecular beam epitaxy (MBE), metalorganic chemical vapor deposition (MOCVD) and the like have been developed, the compound semiconductor growth of a heterostructure has become well known in the industry.

In particular, it is possible to adjust the thickness of even a single atom layer in the growth axis direction of the compound semiconductor, so that two dimensional quantum wells are formed by growing different materials, namely, materials having different energy bandgaps, for a barrier layer and an active layer by a few or tens of nm and then quantumizing the same in the growth axis direction. The quantum device was developed and practically used in the industry using the above-mentioned techniques.

In addition, various kinds of studies have been conducted so as to develop the quantum wire, which is capable of quantumizing by adjusting its size in at least two directions when growing the compound semiconductor crystal so as to increase quantum efficiency, and a lower order ultrafine structure of the quantum dot.

There are three methods of fabricating a quantum wire having a low order ultrafine structure and a quantum dot using conventional compound semiconductor growing techniques.

The first uses a re-growth method. This method is directed to growing a multilayer quantum well structure comprising an active layer and a barrier layer by etching it in a direction perpendicular to the growth axis direction using E-beam lithography outside the growth equipment, and then re-growing the barrier layer at the etched portion so as to restrict the active layer.

However, since these growth methods require exposing the sample to the air and then etching, the surface of the multilayer structure may be polluted by impurities, so that quantum efficiency of the quantum wire is decreased, and the quantum dot is significantly decreased. The crystal growth method is also very costly and expensive equipment is necessary.

Second, a selective epitaxy method uses a mask of dielectric material. This method forms a desired growth pattern on the substrate using the dielectric mask to selectively deposit the compound semiconductor.

This method has an advantage in that the process is simple, and the sample is not exposed to the outside. However, as the dielectric mask is embedded within the sample, quantum efficiency is decreased.

Third, there is a method of growing the fine structure on the substrate having a certain structure with respect to the crystal direction. This method is directed to etching the compound semiconductor of a (100) surface to have a V-shaped groove in order for a (111) surface to be exposed, adjusting growth conditions such as growth temperature and implantation of the impurity of the compound semiconductor to be grown, varying the growth rate in accordance with the orientation, and adjusting the size in a horizontal direction.

In this method, since the compound semiconductor material has different growth rates in accordance with crystal surface orientation, and the active layer is restricted at the bottom surface of the V-shaped groove, it is unnecessary to expose and etch the sample crystal growth in the air, the surface of the multilayer is no easily polluted, and there are not defects due to the use of an additional dielectric mask.

However, since the compound semiconductor material is grown in at the V-shaped groove including along its slope, it is very difficult to adjust size of the horizontal direction due to the quantum well-like wire.

SUMMARY OF THE INVENTION

Accordingly, it is an object of the present invention to provide a crystal growth method for a compound semiconductor which overcomes the problems encountered in conventional crystal growth method for a compound semiconductor.

It is another object of the present invention to provide a crystal growth method for a compound semiconductor which is capable of fabricating a low-dimensional fine structure capable of increasing quantum effects by controlling a lateral dimension. When using a substrate having a V-shaped groove on the (111) surface in the lateral dimension adjusting method using a GaAs substrate fabricated in the V-shaped groove on the (111) surface, since the neck is formed using surface orientation growth which is the semiconductor crystal growth characteristic by fabricating the substrate having the V-shaped groove on the (111) surface for growth rate control in accordance with instable surface orientation, the growth rate may be perfectly controlled in accordance with the surface orientation, so that as lateral dimension can be effectively adjusted.

To achieve the above objects, there is provided a crystal growth method for a compound semiconductor, which includes the steps of forming a plurality of stripe-shaped photoresist film patterns in the direction of (011) on a compound semiconductor substrate having a (100) surface; after removal of the photo-resist, forming a V-groove having a non-(111) surface by a second-etching; first-etching an exposed portion of the compound semiconductor substrate using the photoresist pattern as an etching mask and forming a V-shaped groove having a slope surface of a (111) surface; after removal of the photo-resist, forming a V-groove having non-(111) surface by a second etching; and forming a plurality of quantum wells formed of a barrier layer having a large energy band gap and an active layer having a small energy band gap on the compound semiconductor substrate.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1A:
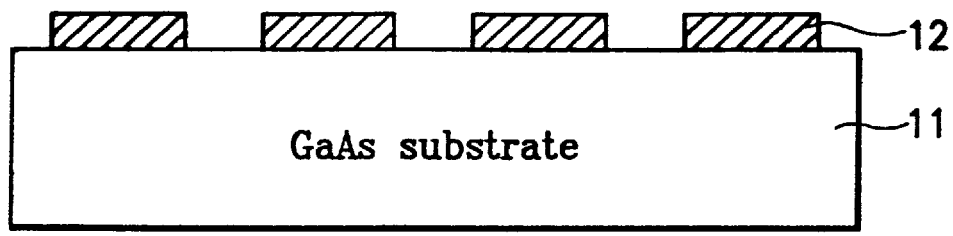
FIGS. 1A through 1E are views showing the crystal growth method for a compound semiconductor according to the present invention.
Figure 1B:
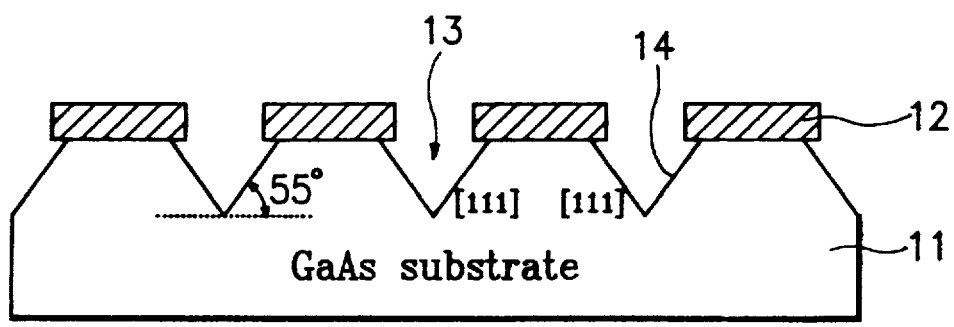
Figure 1C:
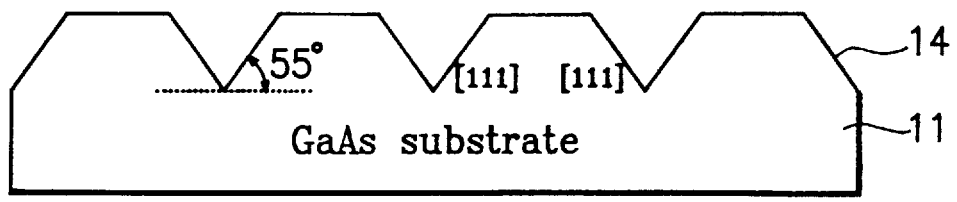
Figure 1D:
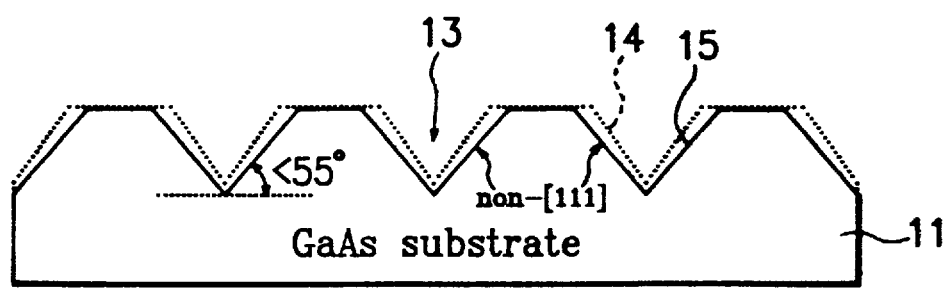

As shown in FIG. 1A, a photoresist pattern 12 is formed on a GaAs semiconductor substrate 11 of a (100) surface, and the GaAs substrate 11 is patterned in a conventional lithography method in a (011) direction.

Here, a V-shaped groove 13 is formed by etching the exposed portion of the semiconductor substrate 11 using an etching solution of $H_2SO_4:H_2O_2:H_2O=1:8:40$ using the photoresistive pattern as an etching mask.

The etching solution is directed to etching the semiconductor substrate 11 in order for the (111) surface to be exposed, and thus the V-shaped groove 13 is formed. The slope surface 14 comprising the (111) surface of the V-shaped groove 13 has a predetermined angle θ1 (55°) with respect to the (100) surface.

The photoresistive film pattern 12 is removed, and the semiconductor substrate 11 is etched by a hydrochloric solution for 1 to 3 minutes, and then is etched by an etching solution of $H_2SO_4:H_2O_2:H_2O=20:1:1$ for 10 to 30 seconds.

The new slope surface 15 becomes a non-(111) surface having a predetermined slope angle θ2 (for example 48°–53°) which is lower than that of the (111) surface having a slope angle of 55° with respect to the original slope surface 14.

Figure 1E:
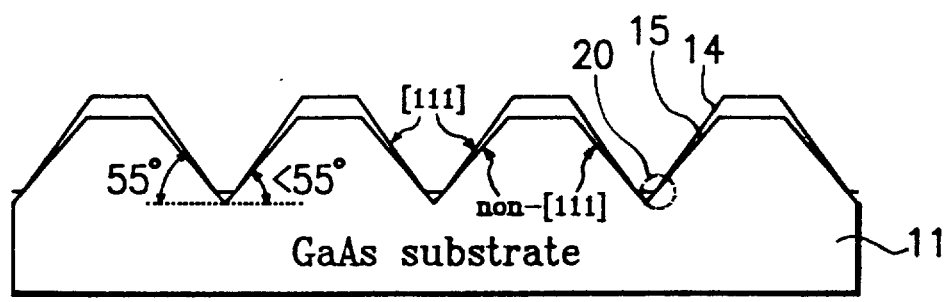
Figure 2:
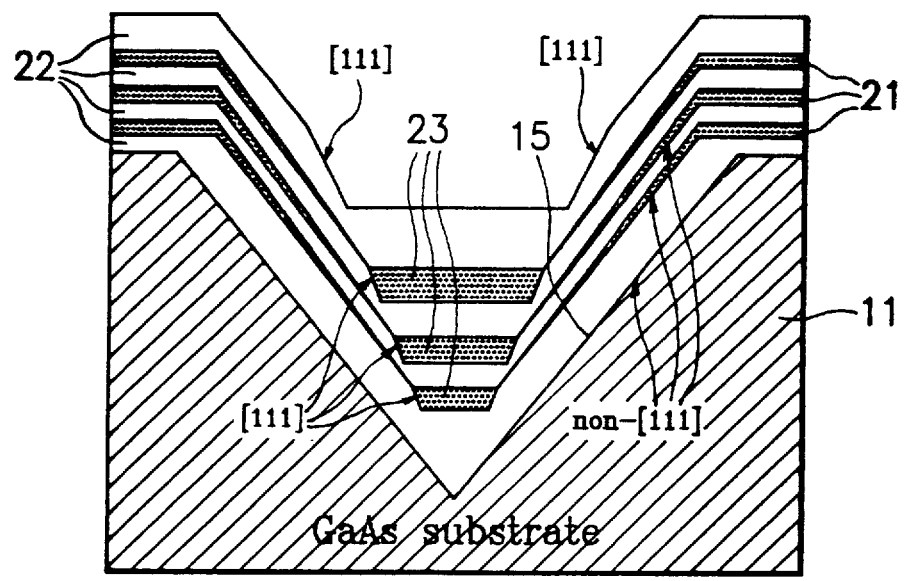
FIG. 2 is a schematic enlarged view showing the ultrafine quantum structure of a neck portion of FIGS. 1A through 1E according to the present invention.

The barrier layer 22 formed of a certain material having a larger energy band gap and an active layer 21 formed of a well material having a smaller energy band gap are formed on the semiconductor substrate 11 on which the new slope surface 15 has the V-shaped groove 13 comprising the non-(111) surface are formed in a pair, and a quantum well formed with a plurality of the pairs are formed. In this regard, please refer to FIGS. 1E and 2.

When the quantum structure is formed of an AlGaAs/GaAs group, the barrier layer 22 is formed of AlGaAs, and the active layer 21 is formed of GaAs, and when the quantum structure is formed of a GaAs/InGaAs group, the barrier layer 22 is formed of GaAs, and the active layer 21 is formed of InGaAs.

When the quantum structure is formed of a GaAs/InGaAs group, the barrier layer 22 is formed by growing the GaAs at a temperature ranging from 400° to 500° C., and the active layer 21 is formed by growing InGaAs at a temperature ranging from 450° to 550° C. The above processes are performed a predetermined times.

Here, the active layer 21 is grown for about 1–3 minutes and has a thickness of tens to 500 Å from the bottom of the V-shaped groove 13 and a gap of tens to 2000 Å.

Generally, since the compound semiconductor formed of GaAs and InGaAs has a characteristic of forming the growth surface so as to form the most stable surface in which the energy is low, the barreir layer 22 and the active layer 21 are grown in the direction where the (111) surface is formed from the slope surface 14 forming the non-(111) surface of the V-shaped groove 13.

In addition, since it is easy to move In and Ga, which are in the III group, from the (111) surface to the non-(111) surface and (100) surface in cooperation with the difference of the number of the gangling bonds at each surface, the barrier layer 22 and the active layer 21 at the boundary between the non-(111) surface and the (111) surface comprising the slope surface 14 are not grown, and the growth rate is slow.

Therefore, the active layer 21 formed on the bottom of the V-shaped groove 13 and the same formed on the slope surface 14 are separated from each other, and the gap of the active layer 21 formed on the bottom of the V-shaped groove 13 is restricted.

As described above, the present invention is directed to forming a V-shaped groove 13 having the (100) surface formed by wet etching on the GaAs semiconductor substrate of the (100) surface and having the (111) surface having a slope angle of 55°, etching the semiconductor substrate to form the non-(111) surface having a slope angle ranging from 48° to 53° which is lower than the slope angle of 55° using the hydrochloric solution and an etching solution of $H_2SO_4:H_2O_2:H_2O=20:1:1$, and forming a quantum well structure in which a plurality of pairs formed of the barrier layers having a large energy band gap and the active layers having a small energy band gap.

Here, since the barrier layer and the active layer are grown and form a stable surface in which the energy is lowest, the barrier layer and the active layer at the slope surface having the V-shaped groove non-(111) surface are grown in the direction that the (111) surface is formed, and the active layer formed on the bottom of the V-shaped groove and the active layer formed on the slope surface become separated since the barrier layer and the active layer are not grown at the boundary between the non-(111) surface and the (111) surface or the grown rate is very slow.

Therefore, the gap of the active layer formed on the bottom of the V-shaped groove is restricted, and it is possible to easily form the quantum wire and the quantum dot.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. A crystal growth method for a compound semiconductor, said method comprising the steps of:

forming a plurality of stripe-shaped photoresist film patterns in the direction of (011) on a compound semiconductor substrate having a (100) surface;

first-etching an exposed portion of the compound semiconductor substrate using the photoresist patterns as an etching mask to form a first V-shaped groove having a (111) slope surface at a slope angle θ1 with respect to the (100) surface;

second-etching the compound semiconductor substrate to convert said (111) slope surface into a non-(111) surface thus forming a second V-shaped groove having a non-(111) slope surface at a slope angle θ2 with respect to the (100) surface, θ2 being less than θ1; and growing a plurality of pairs of quantum wells having a barrier layer and an active layer using surface-oriented growth.

2. The method of claim 1 wherein said compound semiconductor substrate is formed of GaAs.

3. The method of claim 1 wherein said compound semiconductor substrate is first-etched in said first-etching step by a solution of $H_2SO_4:H_2O_2:H_2O=1:8:40$.

4. The method of claim 1 wherein said slope angle θ2 of the second V-shaped groove is within the range of 48°–53°.

5. The method of claim 4 wherein said second-etching step includes:

first step for secondary etching for 1–3 minutes using a hydrochloric solution, and a second step for etching using an etching solution of $H_2SO_4:H_2O_2:H_2O=20:1:1$ for 10–30 seconds.

6. The method of claim 1 wherein said quantum wells are formed of an AlGaAs/GaAs group or a GaAs/InGaAs.

7. The method of claim 6 wherein said barrier layer is formed of GaAs, and said active layer is formed of InGaAs.

8. The method of claim 7 wherein said barrier layer is formed of GaAs grown at 400°–500° C., and said active layer is formed of InGaAs grown at 450°–550° C.

9. The method of claim 8 wherein said active layer has a thickness of tens-500 Å from the bottom of the V-shaped groove, and a gap of 10–2000 Å.

10. The method of claim 9, wherein said active layer is grown for 1–3 minutes.

11. The method of claim 1 wherein said slope angle $\theta 1$ is substantially 55° and said slope angle $\theta 2$ is in the range of 48°–53°.

12. The method of claim 1 wherein said second-etching step includes a first etching using a hydrochloric (HCl) solution for 1–3 minutes, and a second etching using an etching solution of $H_2SO_4:H_2O_2:H_2O=20:1:1$ for 10–30 seconds.

* * * * *